(12) United States Patent
Bedell et al.

(10) Patent No.: US 8,969,992 B2
(45) Date of Patent: Mar. 3, 2015

(54) AUTONOMOUS INTEGRATED CIRCUITS

(71) Applicant: International Business Machines Corporation, Armonk, NY (US)

(72) Inventors: Stephen W. Bedell, Wappingers Falls, NY (US); Norma E. Sosa Cortes, New York, NY (US); Wilfried E. Haensch, Somers, NY (US); Steven J. Koester, Edina, MN (US); Devendra K. Sadana, Pleasantville, NY (US); Katherine L. Saenger, Ossining, NY (US); Ghavam Shahidi, Round Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/199,206

(22) Filed: Mar. 6, 2014

(65) Prior Publication Data

US 2014/0183686 A1    Jul. 3, 2014

Related U.S. Application Data

(62) Division of application No. 12/946,216, filed on Nov. 15, 2010, now abandoned.

(51) Int. Cl.
| | |
|---|---|
| *H01L 31/053* | (2014.01) |
| *H01L 27/142* | (2014.01) |
| *H01L 31/02* | (2006.01) |
| *H01L 31/0747* | (2012.01) |
| *H01L 31/075* | (2012.01) |
| *H01L 31/076* | (2012.01) |
| *H01L 31/078* | (2012.01) |

(Continued)

(52) U.S. Cl.
CPC ........ *H01L 27/142* (2013.01); *H01L 31/02008* (2013.01); *H01L 31/0747* (2013.01); *H01L 31/075* (2013.01); *H01L 31/076* (2013.01); *H01L 31/078* (2013.01); *H01L 31/1804* (2013.01); *H01L 31/202* (2013.01); *Y02E 10/548* (2013.01); *Y02E 10/547* (2013.01)
USPC ............ 257/459; 257/E31.111; 257/E27.123; 257/E27.127

(58) Field of Classification Search
USPC ................ 257/437, 457; 438/59, 67; 136/257
See application file for complete search history.

(56) References Cited

U.S. PATENT DOCUMENTS

| | | |
|---|---|---|
| 5,616,185 A | 4/1997 | Kukulka |
| 6,864,414 B2 | 3/2005 | Sharps et al. |
| 7,098,394 B2 | 8/2006 | Armer et al. |

(Continued)

OTHER PUBLICATIONS

S. Bermejo et al., Prog. Photovolt: Res. Appl., 2005, pp. 617-625, vol. 13, IEEE.

(Continued)

*Primary Examiner* — Earl Taylor
(74) *Attorney, Agent, or Firm* — Cantor Colburn LLP; Louis Percello (57) ABSTRACT

An autonomous integrated circuit (IC) includes a solar cell formed on a bottom substrate of a silicon-on-insulator (SOI) substrate as a handle substrate; an insulating layer of the SOI substrate located on top of the solar cell; and a device layer formed on a top semiconductor layer of the SOI substrate located on top of the insulating layer, wherein a top contact of the device layer is electrically connected to a bottom contact of the solar cell such that the solar cell is enabled to power the device layer.

9 Claims, 12 Drawing Sheets

(51) Int. Cl.
*H01L 31/18* (2006.01)
*H01L 31/20* (2006.01)

(56) References Cited

U.S. PATENT DOCUMENTS

| | | | |
|---|---|---|---|
| 7,276,749 | B2 | 10/2007 | Martin et al. |
| 7,436,038 | B2 | 10/2008 | Engelmann et al. |
| 7,928,317 | B2 | 4/2011 | Atanackovic |
| 8,071,872 | B2 | 12/2011 | Atanackovic |
| 2005/0104089 | A1 | 5/2005 | Engelmann et al. |
| 2006/0267054 | A1 | 11/2006 | Martin et al. |
| 2008/0308143 | A1 | 12/2008 | Atanackovic |
| 2009/0007965 | A1* | 1/2009 | Rohatgi et al. ............... 136/258 |
| 2009/0009675 | A1 | 1/2009 | Cho et al. |
| 2010/0096447 | A1 | 4/2010 | Kwon et al. |
| 2010/0243058 | A1* | 9/2010 | Meguro et al. ............... 136/261 |
| 2011/0086246 | A1 | 4/2011 | Furukawa et al. |
| 2011/0277808 | A1 | 11/2011 | Pavlov et al. |
| 2011/0277820 | A1* | 11/2011 | Ho et al. ............... 136/249 |
| 2012/0040490 | A1* | 2/2012 | Gallazzo et al. ............... 438/87 |
| 2012/0118383 | A1 | 5/2012 | Bedell et al. |
| 2012/0126247 | A1 | 5/2012 | Chen et al. |
| 2012/0126298 | A1 | 5/2012 | Chen et al. |
| 2012/0312353 | A1 | 12/2012 | Kusterer et al. |
| 2013/0074907 | A1 | 3/2013 | Saunders |

OTHER PUBLICATIONS

T.I. Chappell et al., IEEE Trans Elec. Dev., 1979, pp. 1091-1097, vol. ED-26, IEEE.

* cited by examiner

AUTONOMOUS INTEGRATED CIRCUITS

CROSS REFERENCE TO RELATED APPLICATION

This application is a divisional application of U.S. application Ser. No. 12/946,216 (Bedell et al.), filed on Nov. 15, 2010, which is herein incorporated by reference in its entirety.

FIELD

This disclosure relates generally to the field of integrated circuits (ICs), and more specifically to integration of solar cells with ICs.

DESCRIPTION OF RELATED ART

Integrated circuits include various types of devices, including complementary metal-oxide-semiconductor (CMOS) devices. An important factor in IC design is device density and speed. The more densely packed the CMOS devices in a given IC are, the more complex the IC is for a given chip area. High density gives a smaller chip the resources to perform more complex tasks, increasing yield and reducing costs. The higher the speed of the IC, the more computational power and throughput can be achieved with the IC.

One of the limiting factors on IC speed is the parasitic capacitance between individual CMOS devices in the IC, and between the CMOS devices and the IC substrate. A silicon-on-insulator (SOI) substrate may be used to fabricate an IC with reduced parasitic capacitance. An SOI substrate may include a relatively thin top semiconductor layer and a relatively thick bottom substrate separated by an insulating layer. The thickness of the bottom, or handle, substrate may vary from a few microns to hundreds of microns. CMOS devices may be fabricated using the top semiconductor layer. The insulating layer acts to reduce parasitic capacitance between the CMOS devices in the top semiconductor layer and the bottom substrate, which reduces power consumption and increases the speed of the IC.

SUMMARY

In one aspect, an autonomous integrated circuit (IC) includes a solar cell formed on a bottom substrate of a silicon-on-insulator (SOI) substrate as a handle substrate; an insulating layer of the SOI substrate located on top of the solar cell; and a device layer formed on a top semiconductor layer of the SOI substrate located on top of the insulating layer, wherein a top contact of the device layer is electrically connected to a bottom contact of the solar cell such that the solar cell is enabled to power the device layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of autonomous ICs and methods of forming autonomous ICs are provided, with exemplary embodiments being discussed below in detail. An IC may be autonomous (i.e., self-powering, or operable without an external power supply), through integration of a solar cell into the IC; the solar cell may power the CMOS device layer of the IC. Autonomous ICs may be used for many applications in order to eliminate the need for a power supply to power the IC. However, forming an autonomous IC by monolithic integration of a solar cell with the CMOS device layer on the top semiconductor layer of an SOI substrate may entail epitaxial growth of a relatively thick silicon (Si) layer on the top semiconductor layer in order to enable sufficient light absorption by the solar cell. Additionally, placing the solar cell on the top semiconductor layer of the SOI substrate may limit the area of the semiconductor material available for CMOS device fabrication. However, the thicker bottom substrate of the SOI substrate may be used as a handle substrate for formation of a solar cell, and CMOS devices may be formed on the top semiconductor layer of the SOI substrate, allowing formation of a relatively compact autonomous IC and efficient use of the SOI substrate.

Figure 1:
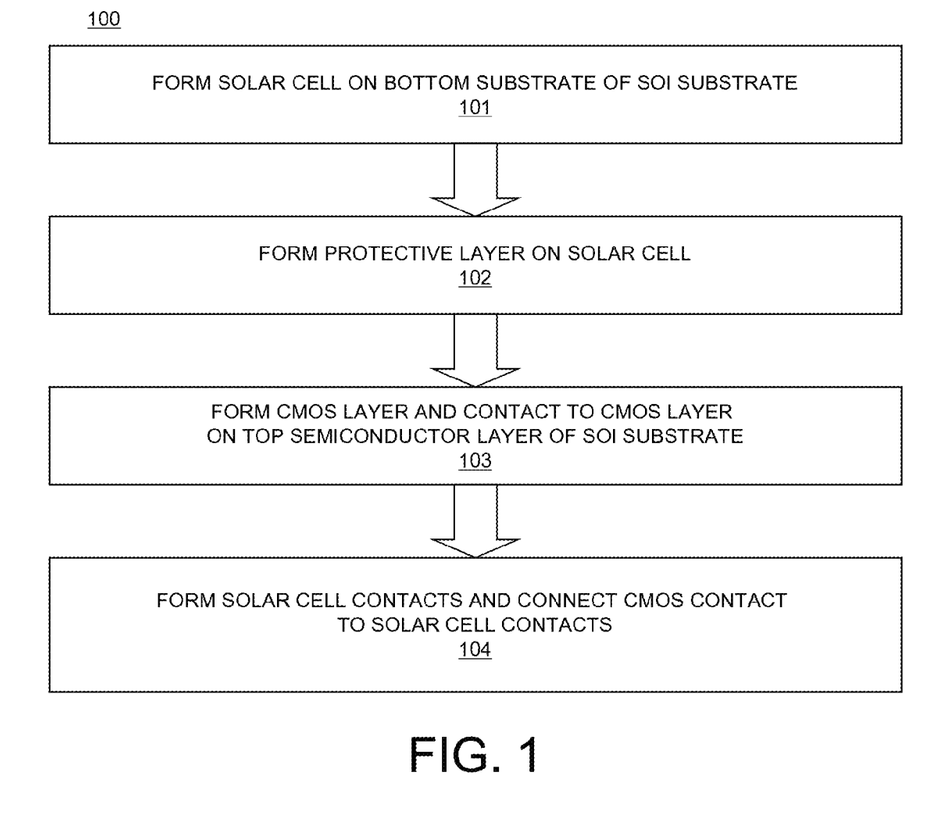
FIG. 1 illustrates an embodiment of a method of forming an autonomous integrated circuit.
Figure 2:
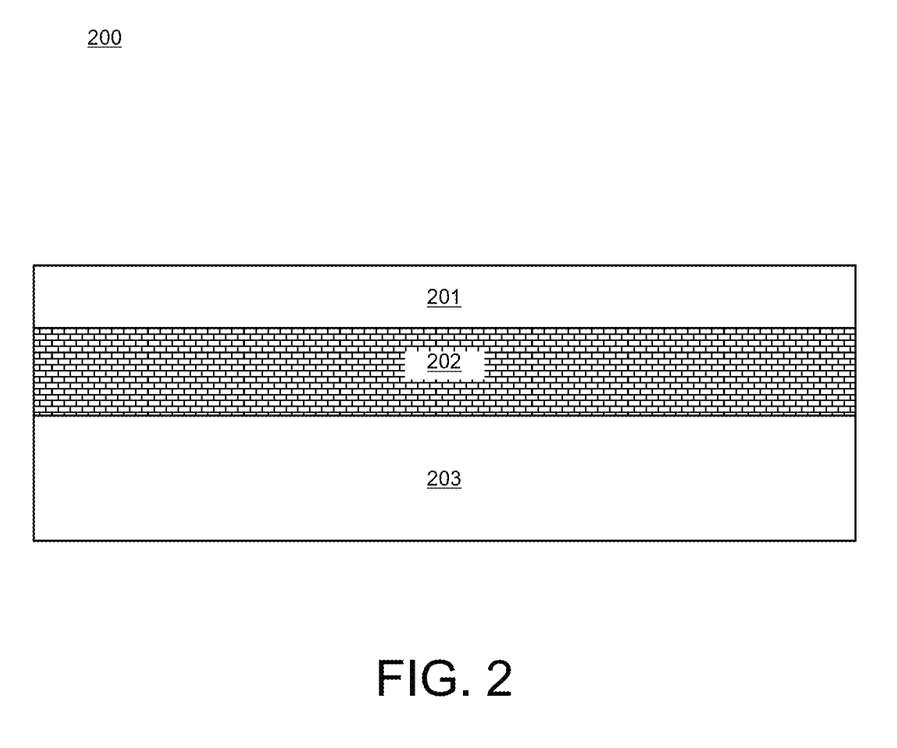
FIG. 2 illustrates an embodiment of a silicon-on-insulator (SOI) substrate.

FIG. 1 illustrates an embodiment of a method 100 of forming an autonomous IC using an SOI substrate, such as substrate 200 shown in FIG. 2. SOI substrate 200 includes relatively thin top semiconductor layer 201, which may be silicon (Si) in some embodiments, an insulator layer 202, which may be a dielectric material such as an oxide, e.g., silicon oxide ($SiO_2$), in some embodiments, and relatively thick bottom substrate 203, which may include Si in some embodiments. The bottom substrate 203 may be textured or non-textured in various embodiments. SOI substrate 200 may be formed by any appropriate method.

Figure 4:
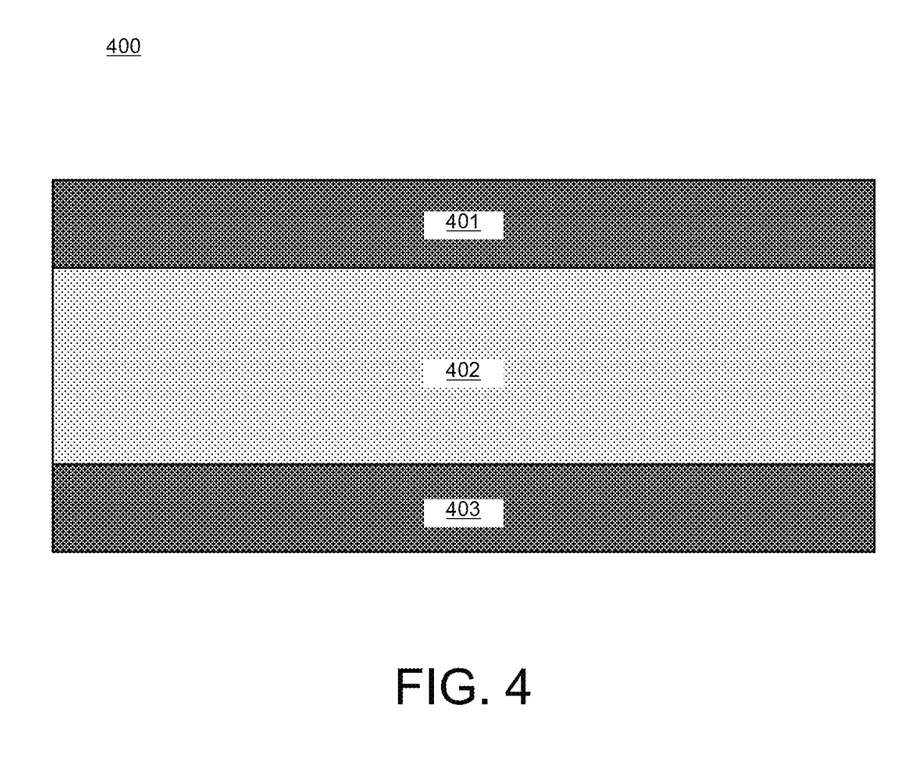
FIG. 4 illustrates an embodiment of a single junction solar cell.
Figure 5:
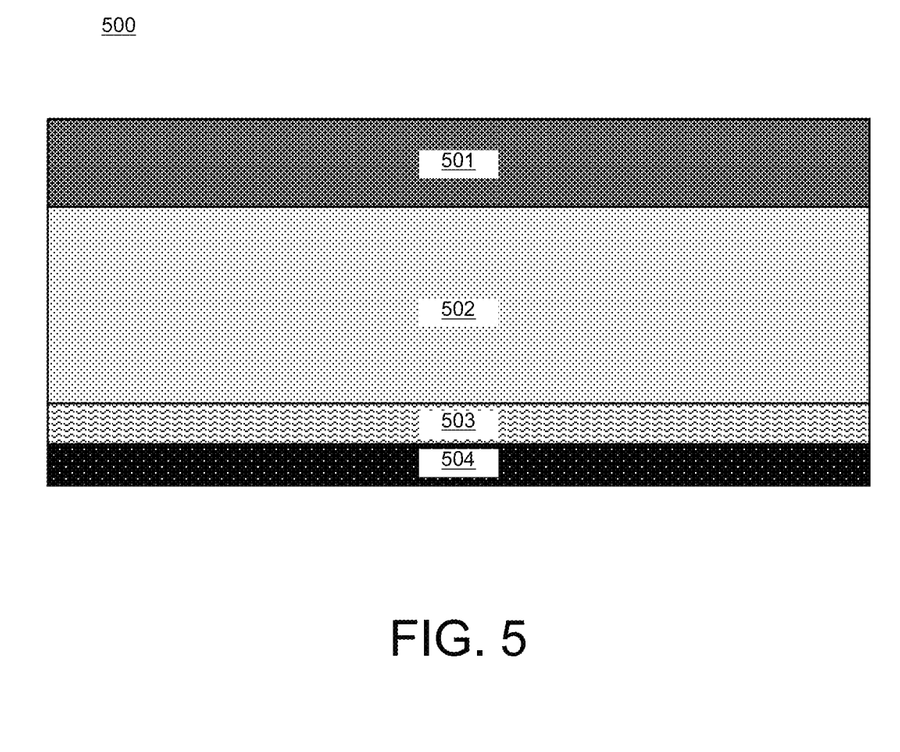
FIG. 5 illustrates an embodiment of a single heterojunction solar cell.
Figure 6:
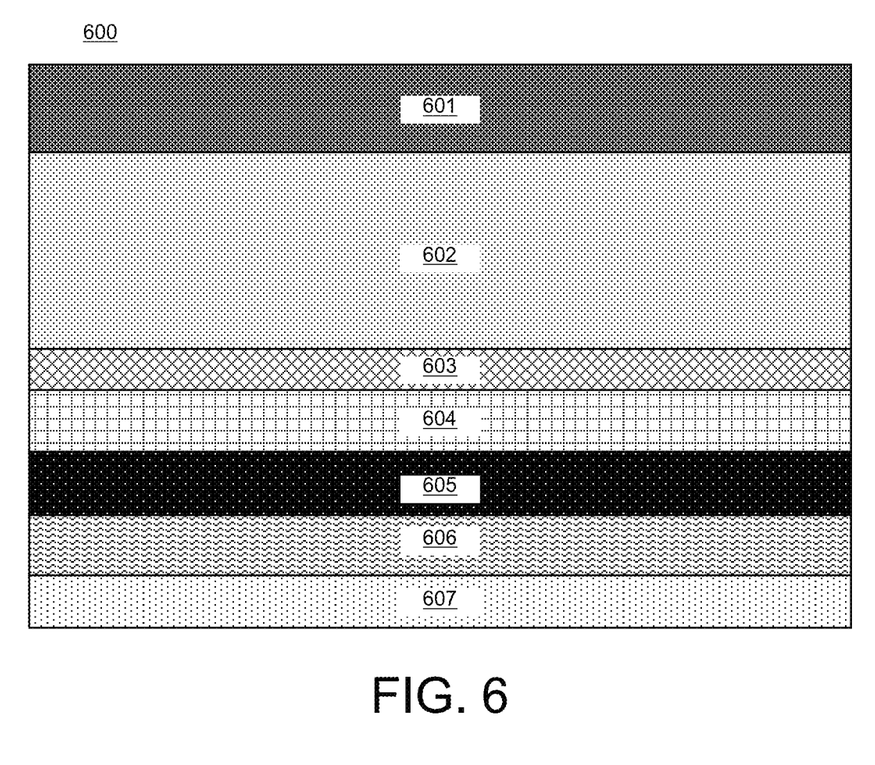
FIG. 6 illustrates an embodiment of a tandem solar cell.

In block 101, a solar cell 301 is formed using bottom substrate 203 as a handle substrate. Solar cell 301 may be any appropriate type of solar cell; the type of solar cell formed for solar cell 301 may be selected based on the power requirements of the finished autonomous IC. In various embodiments, solar cell may include but is not limited to a single junction (single or double-emitter) solar cell, a heterojunction solar cell, or tandem solar cell, or a multijunction solar cell. FIGS. 4-6 show various examples of solar cells that may comprise solar cell 301; however, FIGS. 4-6 are shown for illustrative purposes only, as solar cell 301 may be any type of solar cell that is appropriate for powering a CMOS layer of a finished autonomous IC, may include any number and type of junctions, and may be fabricated in any appropriate manner that uses bottom substrate 203 as a handle substrate. In some embodiments, some or all of the steps of solar cell fabrication may occur before or during the formation of the SOI substrate. For example, in some embodiments, a doped layer (for example, any of doped layers 401, 501, or 601 of FIGS. 4-6, respectively), may be formed in a bottom substrate 203 before a bonding step is performed to joint the bottom substrate 203 to top semiconductor layer 201 to form the SOI substrate 200.

Figure 3:
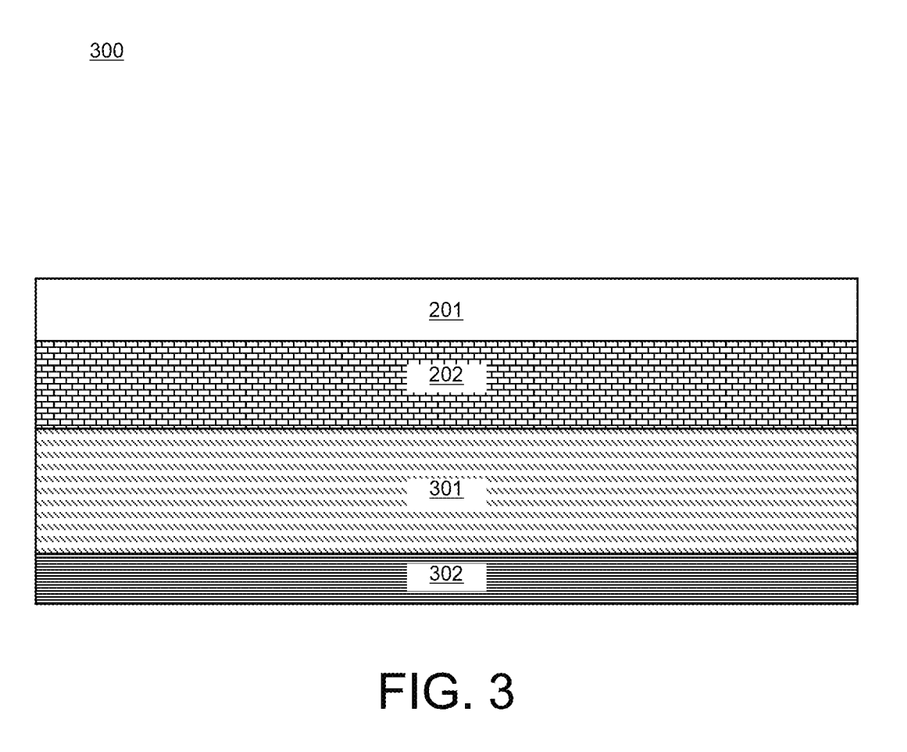
FIG. 3 illustrates an embodiment of the substrate of FIG. 2 after formation of a solar cell and a protective layer.

After formation of solar cell 301 in block 101, a protective coating 302 is formed on the solar cell 301 in block 102. The protective coating 302 may include an oxide, such as transparent conducting oxide (TCO) or plasma enhanced oxide deposited using chemical vapor deposition (CVD), or a nitride in some embodiments.

FIG. 4 illustrates an embodiment of a single junction solar cell 400 that may comprise the solar cell 301 of FIG. 3 that is formed in block 101. A top heavily doped Si layer 401, a lightly doped Si layer 402, and a bottom heavily doped Si layer 403 are formed using bottom substrate 203 of FIG. 2. Layers 401, 402, and 403 may be crystalline Si. Layers 401 and 403 and may have an opposite doping type (n-type or p-type) to each other. Heavily doped Si layers 401 and 403 may be doped with carbon or germanium in some embodiments. Top heavily doped Si layer 401 is adjacent to insulating layer 202 of FIG. 3, and protective coating 302 of FIG. 3 is formed over bottom heavily doped Si layer 403. Top heavily doped Si layer 401 carries $V_{dd}$ for the solar cell 400, and bottom heavily doped Si layer 403 is ground.

FIG. 5 illustrates an embodiment of a single heterojunction solar cell 500 that may comprise the solar cell 301 of FIG. 3 that is formed in block 101. A top heavily doped Si layer 501 and a lightly doped Si layer 502 are formed using bottom substrate 203 of FIG. 2. Layers 501 and 502 may be crystalline Si. An intrinsic layer 503 of hydrogenated amorphous Si (a-Si:H) is then formed on lightly doped layer 502, and a bottom heavily doped Si layer 504 is formed on intrinsic a-Si:H layer 503. Bottom heavily doped Si layer 504 may be a-Si:H or polysilicon in various embodiments. Layers 501 and 504 may have an opposite doping type (n-type or p-type) to each other. heavily doped Si layers 501 and 504 may be doped with carbon or germanium in some embodiments. Top heavily doped Si layer 501 is adjacent to insulating layer 202 of FIG. 3, and protective coating 302 of FIG. 3 is formed over bottom heavily doped Si layer 504. Top heavily doped Si layer 501 carries $V_{dd}$ for the solar cell 500, and bottom heavily doped Si layer 504 is ground.

In an autonomous IC that includes a single heterojunction solar cell 500 for solar cell 301, crystalline layers 501 and 502 may first be formed using bottom substrate 203, and protective coating 302 may be formed over crystalline layer 502. Then, a CMOS layer (discussed below with respect to FIG. 7) may then be formed using top semiconductor layer 201. After formation of the CMOS layer, the protective layer 302 may be removed, amorphous layers 503 and 504 may be formed on crystalline layer 502, and another protective layer (which may be an antireflective coating (ARC), TCO, or nitride in various embodiments) may then be formed on amorphous layer 504.

FIG. 6 illustrates an embodiment of a tandem solar cell 600 that may comprise the solar cell 301 of FIG. 3 that is formed in block 101. Tandem cell 600 includes a top heterojunction solar cell (including layers 601-603) in conjunction with an amorphous photovoltaic (PV) cell (including layers 605-607) joined by a tunneling diode (layer 604). A top heavily doped Si layer 601 and a lightly doped Si layer 602 are formed using bottom substrate 203 of FIG. 3. Layers 601 and 602 may each be crystalline Si. A heavily doped amorphous layer 603 of a-Si:H is formed on lightly doped layer 602. Amorphous layer 603 may have a doping type (n-type or p-type) that is opposite that of layer 601. Tunneling diode layer 604, which may be TCO, is formed on amorphous layer 603. To form the amorphous PV cell, a heavily doped a-Si:H layer 605 is formed on tunneling diode layer 604, an intrinsic a-Si:H layer 606 is formed on heavily doped layer a-Si:H 605, and a heavily doped a-Si:H layer 607 is formed on intrinsic layer 606. Layer 605 may have the same doping type (n-type or p-type) as layers 601 and 602, and layer 607 may have the same doping type (n-type or p-type) as layer 603. Positively doped layers 601, 603, 605, and 607 may be doped with carbon or germanium in some embodiments. Top heavily doped Si layer 601 is adjacent to insulating layer 202 of FIG. 3, and protective coating 302 of FIG. 3 is formed over bottom heavily doped a-Si:H layer 607. Top heavily doped Si layer 601 carries $V_{dd}$ for the solar cell 600, and bottom heavily doped a-Si:H layer 607 is ground.

Figure 7:
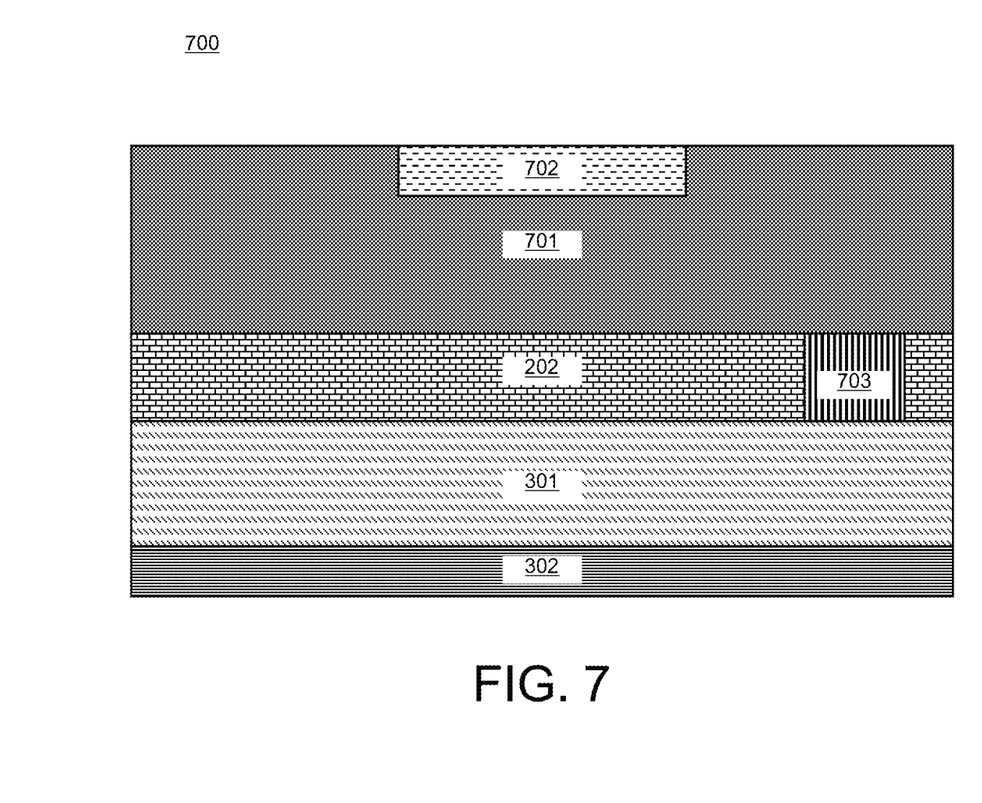
FIG. 7 illustrates an embodiment of the device of FIG. 3 after formation of a CMOS layer and CMOS contact.

Returning to FIG. 1, after formation of solar cell 301 in block 101 and protective coating 302 in block 102, flow proceeds to block 103, wherein top semiconductor layer 201 of the SOI substrate is used to form CMOS device layer 701, as shown in FIG. 7. CMOS device layer 701 may include any appropriate number, type, and configuration of CMOS devices, including but not limited to field effect transistors (FETs). CMOS device layer 701 is contacted by a CMOS contact 702. Via 703 is also formed through insulating layer 202 to connect the $V_{dd}$ (e.g., layer 401 of FIG. 1, layer 501 of FIG. 5, or layer 601 of FIG. 6) of solar cell 301 to the CMOS device layer 701. Protective layer 302 acts to protect solar cell 301 during formation of CMOS layer 701. Contact 702 and via 703 are shown for illustrative purposes only; a CMOS layer 701 may include any appropriate configuration of contacts and vias. CMOS contact 702 and via 703 may comprise a metal such as copper or polysilicon in various embodiments.

In some embodiments, some or all of the steps of CMOS fabrication may occur before or during the formation of the SOI substrate that comprises the autonomous circuit. For example, a CMOS layer 701 may be formed separately in a semiconductor layer (which acts as top semiconductor layer 201), and then bonded to a solar cell 301 formed in a bottom substrate (which acts as bottom substrate 203) using a dielectric glue layer (which acts as insulating layer 202). Contact hole(s), such as for via 703, may be formed in the dielectric glue layer between the bonded CMOS layer 701 and solar cell 301.

Figure 8:
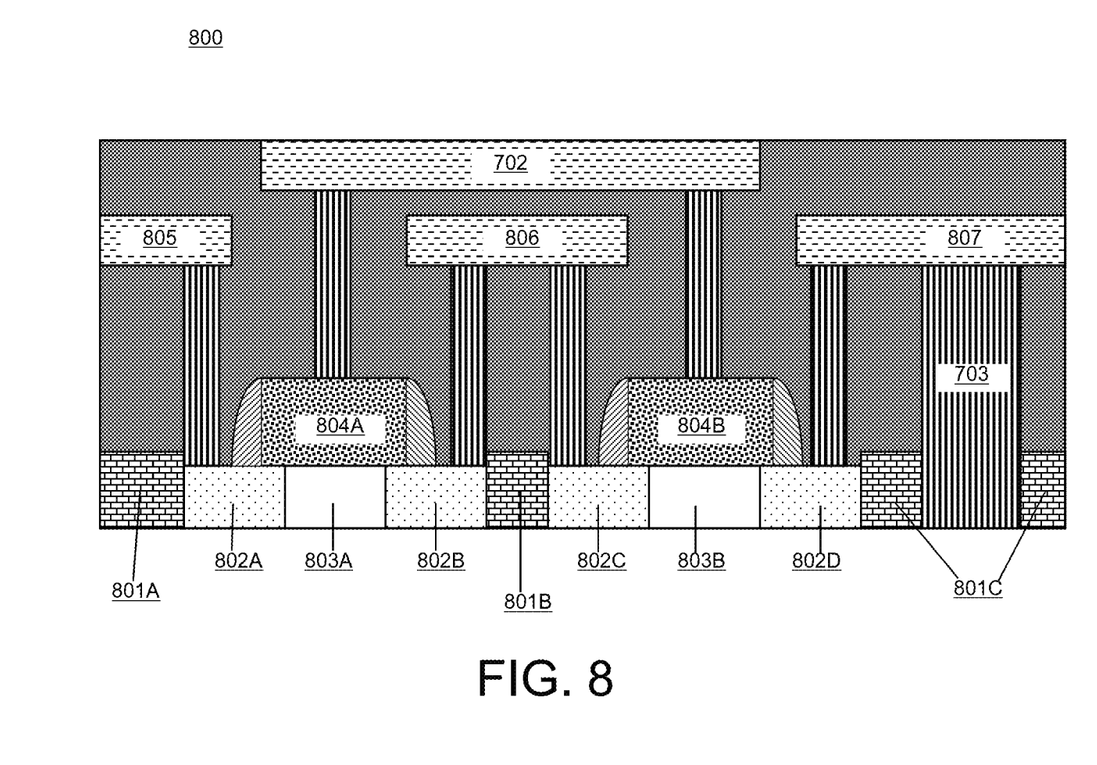
FIG. 8 illustrates an embodiment of a CMOS layer and CMOS contact.

FIG. 8 shows an illustrative embodiment of a CMOS device layer 800 that may comprise the CMOS device layer 701 formed in block 103. Shallow trench isolation (STI) regions 801A-C are formed in semiconductor layer 201 of the SOI substrate. STI regions 801A-C act to insulate CMOS devices from one another, and may be filled with an oxide material in some embodiments. Doped source and drain regions 802A-D are also formed in semiconductor layer 201, on either side of undoped channel regions 803A-B. Source and drain regions 802A-D may be either n-type or p-type. A first FET device includes source and drain regions 802A-B, channel region 803A, and gate 804A; a second FET device includes source and drain regions 802C-D, channel region 803B, and gate 804B. Gates 804A-B may include a high-k dielectric layer and/or a gate metal layer, and may include a nitride spacer located adjacent to the gates 804A-B. CMOS contact 702 (also shown in FIG. 7) provides a gate voltage to FET gates 804A-B. Contact 805, which is connected to source/drain region 802A, may be connected to ground; contact 806, which is connected to source/drain regions 802B-C, is connected to $V_{out}$, and contact 807 receives $V_{dd}$ from solar cell 301 through via 703 (also shown in FIG. 7) and is connected to source/drain region 802D. CMOS layer 800 of FIG. 8 is shown for illustrative purposes only; the CMOS layer 701 of FIG. 7 may include any number, type, and configuration of CMOS devices.

Figure 9A:
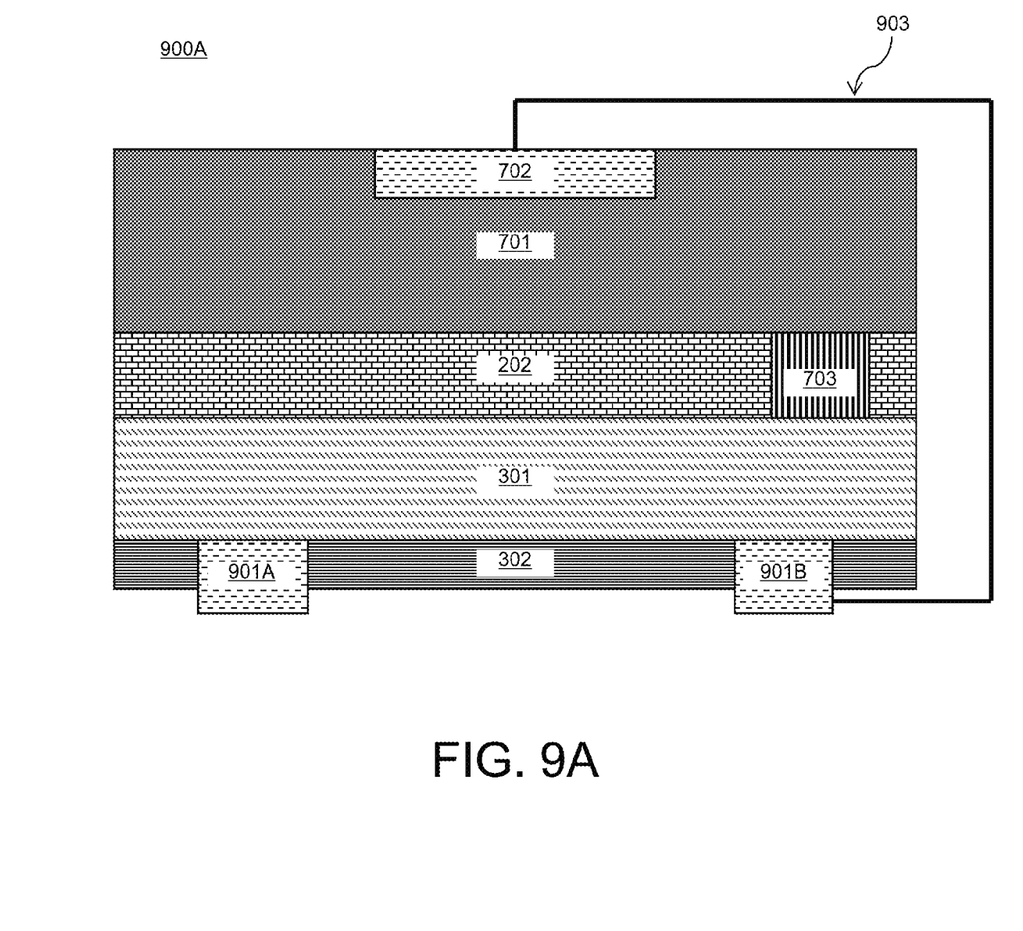
FIG. 9A illustrates an embodiment of the device of FIG. 7 after formation of solar cell contacts.
Figure 9B:
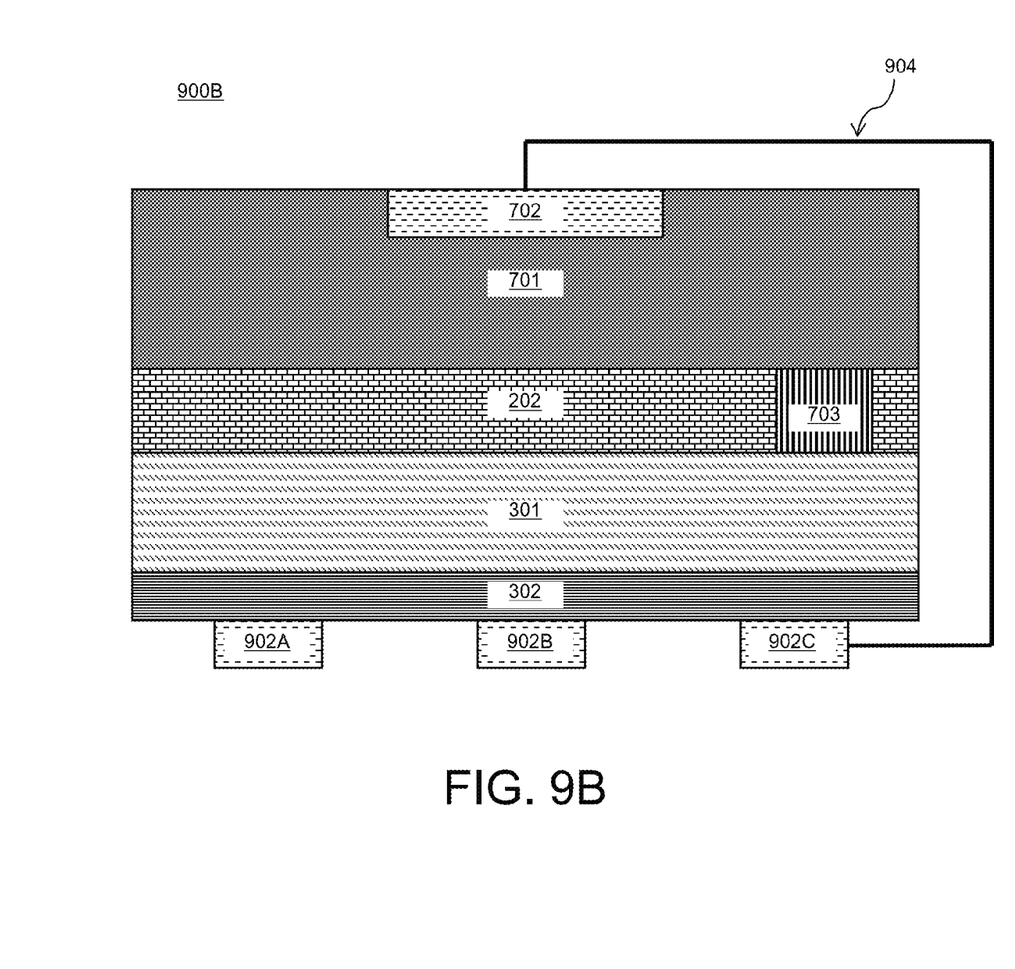
FIG. 9B illustrates an embodiment of the device of FIG. 7 after formation of solar cell contacts.

After formation of CMOS device layer 701, including CMOS contact 702 and via 703, in block 103, in block 104, one or more contacts to solar cell 301 are formed, and the contacts to solar cell 301 are connected to CMOS contact 702, allowing solar cell 301 to power CMOS device layer 701, resulting in autonomous ICs 900A-B such as are shown in FIGS. 9A-B. In some embodiments, there may be additional processing of the solar cell 301 (such as is discussed above with respect to FIG. 5) after completion of CMOS layer 701 and before formation of the solar cell contacts. In FIG. 9A, protective layer 302 is a non-conducting material, so solar cell contacts 901A-B are formed by recessing protective layer 302 such that solar cell contacts 901A-B are directly contacted to solar cell 301. Electrical connections, such as example electrical connection 903, are then formed from solar cell contacts 901A-B to CMOS contact 702, allowing solar cell 301 to power CMOS layer 701. In FIG. 9B, protective layer 302 is a conducting material, such as TCO, and solar cell contacts 902A-C are formed on protective layer 302. Electrical connections, such as example electrical connection 904, are then formed from solar cell contacts 902A-C to CMOS contact 702, allowing solar cell 301 to power CMOS layer 701. Solar cell contacts 901A-B and solar cell contacts 902A-C may be a metal, such as copper, or polysilicon in various embodiments. Solar cell contacts 901A-B of FIGS. 9A and 902A-C of FIG. 9B are shown for illustrative purposes only; an autonomous IC may include any appropriate number and configuration of solar cell contacts. In some embodiments, protective layer 302 may be removed, and the solar cell contacts may be formed directly on solar cell 301. In operation, solar cell 301 receives solar energy, and transforms the solar energy into electrical energy to power CMOS layer 701.

Figure 10:
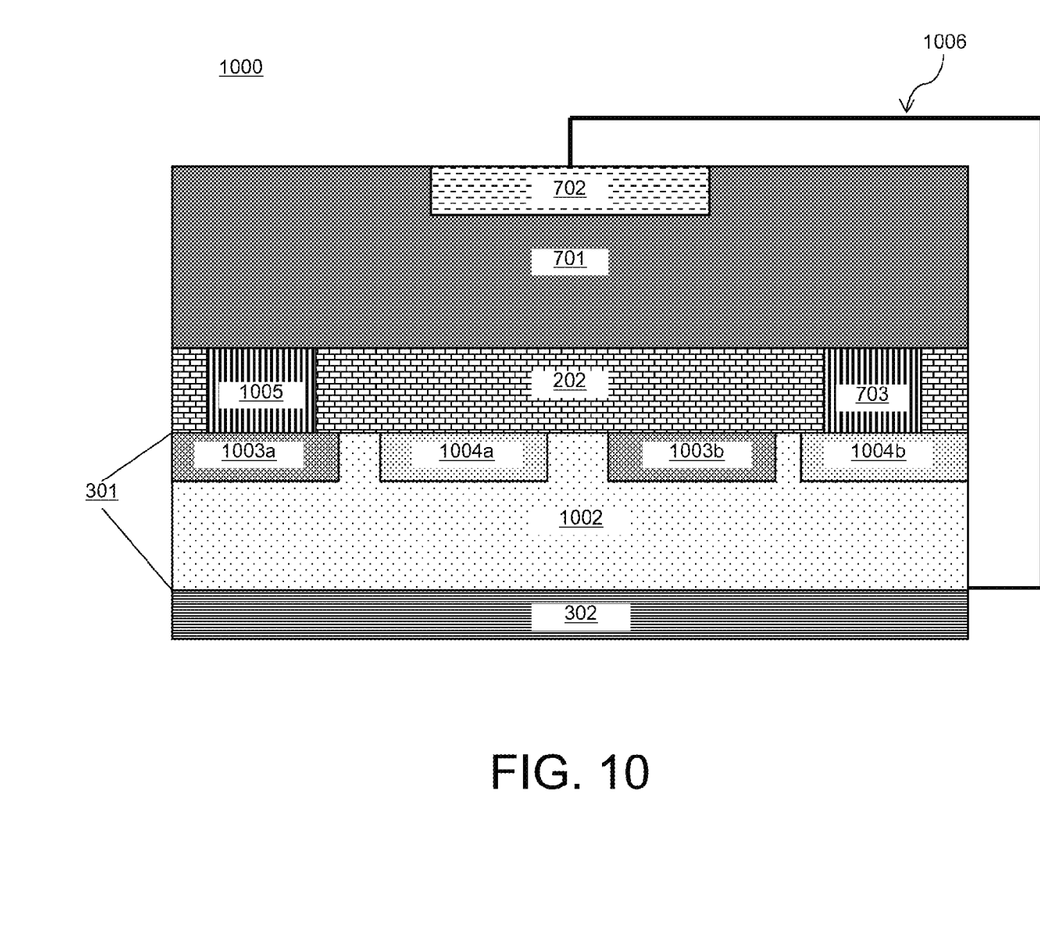
FIG. 10 illustrates an embodiment of an autonomous IC comprising an interdigitated solar cell.

FIG. 10 illustrates an embodiment of an autonomous IC 1000 that may be formed using the method 100 of FIG. 1, in which the solar cell 301 has an interdigitated configuration. Solar cell 301 includes heavily doped regions 1003$a$-$b$ and 1004$a$-$b$ in lightly doped region 1002. Heavily doped regions 1003$a$-$b$ and 1004$a$-$b$ are each adjacent to insulator layer 202. Heavily doped regions 1003$a$-$b$ may have a doping type (n-type or p-type) that is opposite to a doping type of heavily doped regions 1004$a$-$b$, and lightly doped region 1002 may have a doping type (n-type or p-type) that is the same as that of heavily doped regions 1004$a$-$b$. Heavily doped region 1003$a$ supplies ground to the CMOS device layer 701 through via 1005, which is formed in insulator layer 202, and heavily doped region 1104$b$ supplies $V_{dd}$ to CMOS device layer 701 through via 703. The bottom of solar cell 301 is electrically connected to CMOS contact 702 by an electrical connection such as example electrical connection 1006 to power the CMOS device layer 701 in operation.

Figure 11:
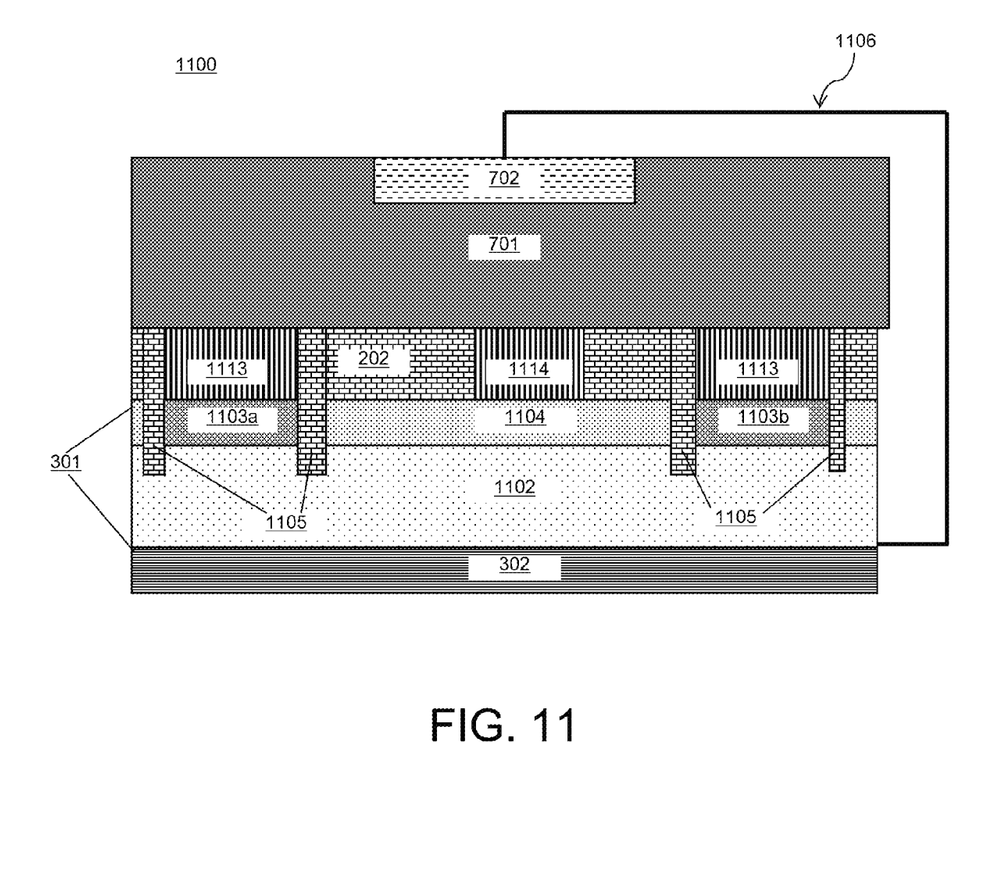
FIG. 11 illustrates another embodiment of an autonomous IC comprising an interdigitated solar cell.

FIG. 11 illustrates another embodiment of an autonomous IC 1100 that may be formed using the method 100 of FIG. 1 in which the solar cell 301 has an interdigitated configuration. Heavily doped regions 1103$a$-$b$ and 1104 (analogous to heavily doped regions 1003$a$-$b$ and 1004$a$-$b$ of device 1000 of FIG. 10) are located in lightly doped region 1102 and separated by insulating spacers 1105, which may comprise the same material as insulating layer 202. Heavily doped region 1104 supplies ground to the CMOS device layer 701 through via 1114, which is formed in insulator layer 202, and heavily doped regions 1103$a$-$b$ supply $V_{dd}$ to CMOS device layer 701 through vias 1113. The bottom of solar cell 301 is electrically connected to CMOS contact 702 by an electrical connection such as example electrical connection 1106 to power the CMOS device layer 701 in operation.

The technical effects and benefits of exemplary embodiments include a relatively compact autonomous IC that makes efficient use of an SOI substrate.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. An autonomous integrated circuit (IC), comprising;
a solar cell formed on a bottom substrate of a silicon-on-insulator (SOI) substrate, the bottom substrate comprising a handle substrate of the solar cell, the solar cell comprising a bottom contact;
an insulating layer of the SOI substrate located directly on top of the bottom substrate; and
a device layer formed in a top semiconductor layer of the SOI substrate, wherein the top semiconductor layer is located directly on top of the insulating layer, the device layer comprising a top contact, and wherein the top contact of the device layer is electrically connected to the bottom contact of the solar cell such that the solar cell is enabled to power the device layer during operation of the device layer.

2. The autonomous IC of claim 1, wherein the top semiconductor layer and bottom substrate of the SOI substrate comprise silicon, and wherein the insulating layer of the SOI substrate comprises silicon oxide.

3. The autonomous IC of claim 1, further comprising a via located in the insulating layer connecting the device layer to the solar cell.

4. The autonomous IC of claim 1, further comprising a protective layer located directly under a bottom surface of the solar cell.

5. The autonomous IC of claim 4, wherein the protective layer comprises one of transparent conducting oxide and a nitride.

6. The autonomous IC of claim 4, wherein the bottom contact of the solar cell is formed directly under the protective layer, such that the protective layer is located between the bottom contact and the solar cell.

7. The autonomous IC of claim 4, wherein the bottom contact of the solar cell is formed in a recess in the protective layer and on the solar cell, such that the bottom contact is in direct contact with the solar cell.

8. The autonomous IC of claim 1, wherein the solar cell comprises one of a single junction solar cell, a single heterojunction solar cell, an interdigitated solar cell, and a tandem solar cell.

9. The autonomous IC of claim 1, wherein the device layer comprises a plurality of field effect transistors (FETs) formed in the top semiconductor layer of the SOI substrate.

* * * * *